United States Patent [19]

Hilbourne et al.

[11] B 3,991,325

[45] Nov. 9, 1976

[54] TRANSISTOR AMPLIFIER FOR GENERATING COMPLEMENTARY TRAPEZOIDAL WAVEFORMS

[75] Inventors: Robert Arthur Hilbourne, Chandlersford; Peter James, Purley, both of England

[73] Assignee: U.S. Philips Corporation, New York, N.Y.

[22] Filed: Aug. 16, 1974

[21] Appl. No.: 497,960

[44] Published under the second Trial Voluntary Protest Program on January 20, 1976 as document No. B 497,960.

[52] U.S. Cl. .............................. 307/270; 307/261; 307/263; 307/268; 328/57; 328/62
[51] Int. Cl.[2] ................... H03K 1/00; H03K 3/26; H03K 5/12
[58] Field of Search ........... 307/260, 261, 263, 264, 307/268, 270; 328/57, 60, 62

[56] References Cited
UNITED STATES PATENTS

| | | |
|---|---|---|
| 3,252,045 | 5/1966 | Griffin ............................. 307/228 |
| 3,548,219 | 12/1970 | Lawrie, Jr. et al. ................. 307/268 |
| 3,668,436 | 6/1972 | Bacon ................................ 328/57 |
| 3,868,519 | 2/1975 | Green ............................... 307/270 |

Primary Examiner—Stanley D. Miller, Jr.
Attorney, Agent, or Firm—Frank R. Trifari; Bernard Franzblau

[57] ABSTRACT

A transmission line amplifier for generating substantially identical complementary trapezoidal output waveforms for a twisted pair transmission line thereby reducing cross-talk on the twisted pair lines. Current summing means and a capacitor are used to insure that when the capacitor is midway through its discharge-charge cycle, the two output currents are at the midpoint of their transition stage and are equal whereby the sum of the complementary trapezoidal output waveforms is constant.

9 Claims, 2 Drawing Figures

TRANSISTOR AMPLIFIER FOR GENERATING COMPLEMENTARY TRAPEZOIDAL WAVEFORMS

The present invention relates to a transmission line amplifier and more particularly to a transmission line amplifier which produces complementary output waveforms substantially trapezoidal in shape in order to minimize the interference between a transmission line supplied from one transmission line amplifier and a transmission line supplied from an associated line amplifier. The properties of the trapezoidal waveform are explained in British Pat. No. 542,366. It is also important that the complementary output waveforms switch between states in such a manner that the positive going transition of one waveform cancels out, as far as possible, the negative going transition of the complementary waveform.

Accordingly it is an object of the present invention to produce a transmission line amplifier having complementary outputs of a substantially trapezoidal waveform in which the positive and negative going switching transitions are substantially equalised, i.e., the positive going transition of one waveform is the mirror image of the negative going transition of the complementary waveform.

According to the present invention there is provided a transmission line amplifier producing complementary output waveforms which output waveforms are substantially trapezoidal. The transmission line amplifier includes a single capacitor which is charged in one direction when a first output condition is required and in the opposite direction when a second output condition is required. The amplifier further comprises an output circuit for producing the output waveforms including a current summing means for clipping the center portion of the discharge and charge waveforms of said capacitor to produce said substantially trapezoidal waveform and in which the sum of the two output waveforms is substantially constant.

An embodiment of the present invention will now be described, by way of example, with reference to the accompanying drawings, in which.

Figure 1:
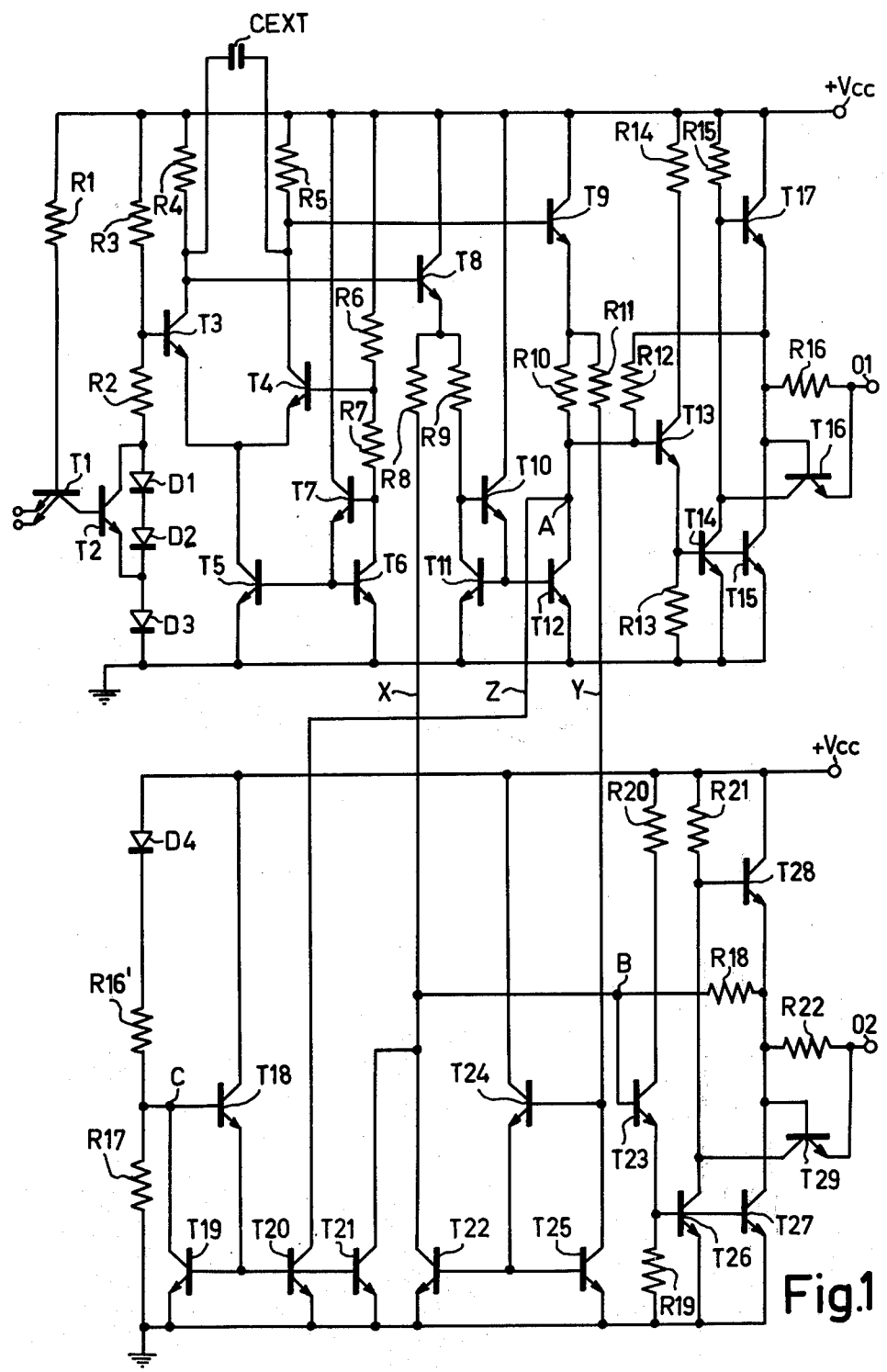
FIG. 1 shows a transmission line amplifier according to the present invention.

Referring now to FIG. 1, transistors T1 and T2 constitute a T.T.L. type of input stage, the base of transistor T1 being connected via resistor R1 to the positive voltage line +VCC and the emitters of transistor T1 forming the input terminals for the circuit. The collector of transistor T1 is connected to the base of transistor T2, the emitter-collector path of transistor T2 being connected in parallel with diodes D1 and D2. The emitter of transistor T2 is connected via diode D3 to the negative voltage line which is shown at ground potential. The collector of transistor T2 is connected via the series combination of resistors R2 and R3 to the positive supply line, the mid-point of resistors R2 and R3 being connected to the base of a transistor T3. Transistor T3 together with transistor T4 forms a long-tailed pair combination the tail current being supplied by a transistor T5. The collector of transistor T3 is connected to the positive supply line +VCC via a resistor R4 and the collector of transistor T4 is connected to +VCC via a resistor R5. Two external terminals EXT1 and EXT2 are provided across which is connected an external capacitor C EXT. The base of transistor T4 is provided with a reference voltage by an arrangement consisting of resistors R6, R7 and transistors T6, T7.

The collector of transistor T3 is connected to the base of a transistor T8 and the collector of transistor T8 is connected to +VCC. The emitter of transistor T8 is connected to resistors R8, R9. The collector of transistor T4 is connected to the base of a transistor T9 the collector of which is connected to +VCC and the emitter of which is connected to two resistors R10, R11 in a similar arrangement to resistors R8 and R9. The resistors R9 and R10 are connected to the upper part of the circuit to produce one of the outputs of the circuit and the resistors R8, R11 are connected to the lower part of the circuit to produce the complementary output.

Resistor R9 is therefore connected to the base of a transistor T10 and to the collector of a transistor T11. The collector of transistor T10 is connected to the positive supply rail +VCC, and its emitter is connected to the base of a transistor T12. The emitters of transistors T11 and T12 are connected to the negative supply rail. The collector of transistor T12 is connected to the lower part of the circuit via lead Z, to one end of resistor R10, to a resistor R12 and to the base of a transistor T13. The emitter of transistor T13 is connected to the bases of transistors T14 and T15 and via a resistor R13 to ground. The collector of transistor T13 is connected via a resistor R14 to +VCC.

The emitters of transistors T14 and T15 are connected to ground, and the collector of transistor T14 is connected to the collector of a transistor T16, to the base of a transistor T17 and to +VCC via a resistor R15. The collector of transistor T15 is connected to the base of transistor T16, to an output resistor R16, to the emitter of transistor T17 and via resistor R12 to the base of transistor T13. The collector of transistor T17 is connected to the positive supply rail and the emitter of transistor T16 is connected to output terminal 01.

The leads X, Y and Z are connected to the lower portion of the circuit which produces the complementary output to output terminal 01 which is referenced 02. The lower portion of the circuit consists of the series connection of a diode D4, resistor R16' and a resistor R17 which are connected between the positive supply voltage +VCC and the negative supply rail which is at ground potential. The common point of resistors R16' and R17 is connected to the base of a transistor T18 and to the collector of a transistor T19. The emitter of transistor T19 is connected to the negative supply rail and the emitter of transistor T18 is connected to the base of transistor T19 and to the base of transistors T20 and T21. The emitter of transistor T18 is connected to the positive supply rail +VCC. The emitters of transistors T20 and T21 are connected to ground. The collector of transistor T20 is connected to lead Z and the collector of transistor T21 being connected to lead X. Lead X is also connected to the collector of a transistor T22, to the base of a transistor T23 and to a resistor R18.

The emitter of transistor T22 is connected to the negative supply rail.

Lead Y is connected to the base of a transistor T24 and to the collector of a transistor T25. The emitter of transistor 24 is connected to the common base connections of transistors T22 and T25, the collector being connected to the positive supply rail +VCC. The emitter of transistor T23 is connected via a resistor R19 to the negative supply rail and to the commoned bases of transistors T26 and T27. The collector of transistor T23 is connected via resistor R20 to the positive supply rail +VCC. The collector of transistor T26 is connected via a resistor R21 to the positive supply rail +VCC, to the base of a transistor T28 and to the collector of a transistor T29. The collector of transistor T28 is connected to the positive supply rail +VCC and the emitter of transistor T28 is connected to one end of resistor R18 and to a resistor R22, to the base of transistor R29 and to the collector of transistor T27. The other end of resistor R22 is connected to the output terminal 02 which is also connected to the emitter of transistor T29.

Figure 2:
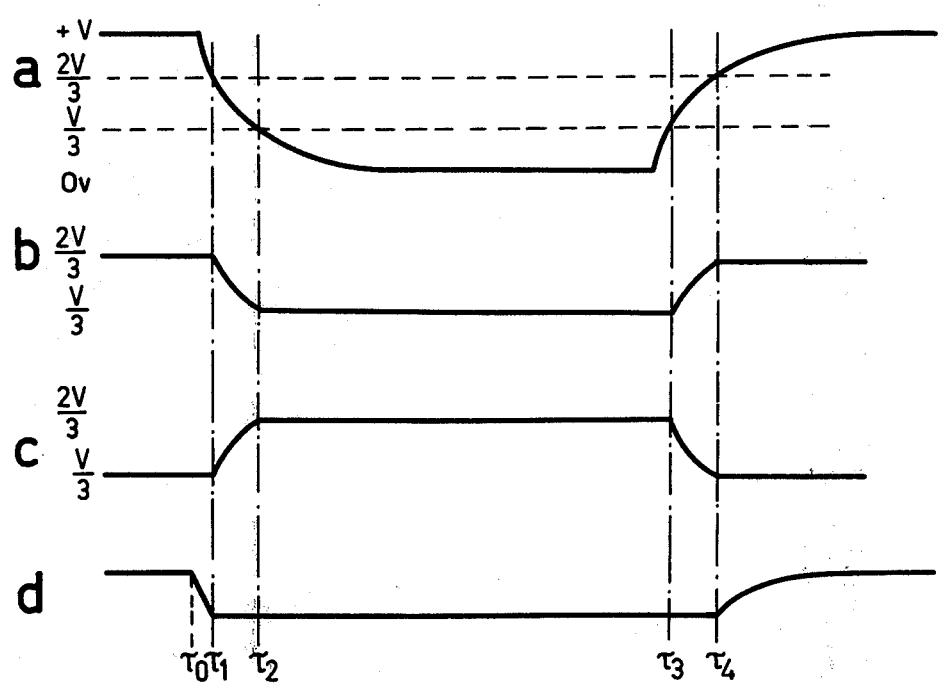
FIG. 2 shows voltage waveforms occurring in the circuit of FIG. 1.

Referring now to FIG. 2, there are shown waveforms which explain the operation of the circuit according to the present invention. FIG. 2a shows a normal capacitor discharge characteristic when a capacitor is discharged across a resistor followed by a normal capacitor charge characteristic when a capacitor is charged across a resistor. FIG. 2b shows the central third of the waveform of FIG. 2a in which the capacitor is charged and discharged only over the center one third of its voltage range. FIG. 2c shows the inverse of FIG. 2b.

It can be seen by reference to FIG. 2b that the transition from $2v/3$ to $V/3$ is approximately a straight line and the corresponding transition from $V/3$ to $2V/3$ is also approximately a straight line. Therefore the waveforms $b$ and $c$ of FIG. 2, which may represent the currents in each wire of a twisted pair, will substantially cancel each other out during the transition periods $\tau 1 - \tau 2$ and $\tau 3 - \tau 4$.

FIG. 2d illustrates, in a rather exaggerated manner, the effect of choosing a portion of the charge and discharge waveform other than the central portion. In FIG. 2d the first one third from $v$ to $2V/3$ is chosen. It can easily be seen that the discharge from $\tau 0$ to $\tau 1$ is extremely rapid and the charge from $\tau 4$ onwards is extremely slow. Thus if the central section is not chosen the transition portions of the complementary output waveforms do not substantially balance one another out. It is therefore important in the circuit of FIG. 1 that the portion of the charge and discharge waveform chosen be kept as close as possible to the central section.

Referring now to FIG. 1, one or more inputs may be received by transistor T1, these inputs being of a suitable TTL voltage, e.g. 0 volts to +5 volts. With one or more of the inputs to T1 in a low (0 volt) state, transistor T1 is on and transistor T2 will be off. The mid-point of resistors R2 and R3 will therefore sit at a positive voltage determined by the series chain R3, R2, D2, D1 and D3, which voltage will be more positive than the reference voltage on the base of T4 since the voltage drops across diodes D3, D1, D2 and resistor R2 will exceed the voltage drops across transistor T6 and resistor R7. Transistor T3 will therefore be ON and transistor T4 will be OFF. The collector of transistor T3 will sit at VCC − IR4 and the collector of transistor T4 will sit at approximately the positive supply rail voltage +VCC.

The base of transistor T9 will therefore sit at +VCC and the base of transistor T8 will sit at a voltage +VCC − IR4, where I is the current through the resistor R4 and hence through the constant current source transistor T5. The transistors T8 and T9 are emitter followers and therefore their emitters will sit at 1 VEE below the potential on their bases.

The combination of transistors T10, T11 and T12 act as a current mirror combination in such a way that the current passing through transistor T11 is always equal to the current passing through transistor T12.

With the emitter of transistor T9 at +VCC − VBE, transistors T13, T14, and T15 are on and transistor T17 is off because its base is negative with respect to its emitter due to the collector current of transistor T14 passing through resistor R15.

In a similar manner transistors T23, T26 and T27 are off and transistor T28 is therefore on. This is because the potential at the point B is at +VCC − IR4 − VBE.

If now all the inputs to transistor T1 become positive, transistor T3 switches off and T4 switches on. Positive and negative going ramps will therefore appear on the bases of transistors T8 and T9 of the form as shown in FIG. 2a. Considering first transistor T9, the current in resistor R10 will decrease as the emitter of transistor T9 is taken towards the negative supply rail. The current in transistor T11 however, will increase and therefore the current in T12 will increase. After a certain time the current flowing into point A through resistor R10 will exactly balance the current in resistor R12, the collector current in transistor T12 and the collector current of transistor T20 flowing through lead Z. This condition will occur, with reference to FIG. 2, at the time $\tau 1$. That is to say it will occur a certain time $\tau 0 - \tau 1$ after the inputs to T1 go positive. At the time $\tau 1$ the base drive to transistor T13 will reduce and consequently the base drive to transistors T14 and T15 will be reduced. The collector of transistor T15 tends to rise towards the positive supply rail which in turn tends to reduce the current in resistor R12 since transistors T13 − T17 form a negative feedback amplifier.

Therefore the output voltage on the collector of transistor T15 will follow and have the same shape as the ramp voltage on the base of transistor T8 which follows and has the same shape as the current ramp at the point A. This is because the current ramp at point A follows the difference in voltage between the base of transistor T8 and T9 which is equal to twice the individual ramp voltages at either the base of T8 or T9 since as explained above the current in resistor R10 is reducing and the current in transistor T12 is increasing.

Transistor T17 therefore turns on and the emitter voltage of transistor T17, which is commoned to the collector voltage of transistor T15, rises to VCC − 1 VBE and stabilises at this voltage at a time $\tau 2$ (see FIG. 2).

The node B in the lower part of the circuit performs the same function as the node A in the upper part of the circuit but in a reverse manner.

Thus the transistor T27 is turned on and the transistor T28 is turned off. A current flow is then obtained from +VCC via the collector emitter path of transistor T17 and the collector emitter path of transistor T27 to ground.

In an ideal circuit when the two plates of capacitor CEXT are at the same potential the outputs 01 and 02 should be at a voltage equal to half way through the voltage swing.

This is achieved by the components D4, R16', R17 and transistors T18 − T21. At the center point the net current at the node A available to drive the base of T13 should be substantially zero. That is it should be just enough to keep transistor T13 on without sufficient drive to cause it to conduct further. When the voltages at both plates of C external are equal the currents in R10 and transistor T12 are equal and opposite (since the bases of T8 and T9 will be at equal potentials) and they will therefore balance each other out.

The current into node A through R12 is equal to $$\frac{\frac{VCC - VBE}{2} \, 2 \, Vbe}{R12}$$

The current out of node A into the collector of T20 must therefore be equal to this at all temperatures and supply voltages for the circuit to maintain the above condition. Therefore the collector current into T20 must be equal to $$\frac{VCC - 5 \, VBE}{2R12}$$

This current is calculated as follows. Current into T18, T19 at node C.

$$= \frac{VCC - Vbe - 2Vbe - 2Vbe}{R16' + R17} = \frac{VCC - 5Vbe}{R16' + R17}$$

and this is identical to the collector current in T20.

Therefore if $R16' + R17 = 2R12$ then the condition is satisfied. In the circuit therefore $R16' + R17 = 2R12$ and thus for all temperatures and supply voltages the condition will be satisfied since the change in R16' and R17 and the Vbe's of the transistors will be matched in an integrated circuit.

From the above it is seen that the center points of the two waveforms are passed through at the same time. Thus if the output stages T13 – T17 and T23 – T27 are complementary the output waveforms will be identical within manufacturing tolerances.

What we claim is:

1. A transmission line amplifier for producing at first and second output terminals complementary trapezoidal output waveforms comprising, an input terminal, a single capacitor, circuit means having an input coupled to the input terminal and first and second terminals connected to respective electrodes of said capacitor, said circuit means including means responsive to a change from a first input condition to a second input condition to discharge the capacitor from a first direction of charge and to charge it in the opposite direction to produce a first output condition and responsive to a change from the second input condition to the first input condition to discharge the capacitor and to recharge it in the first direction to produce a second output condition, and means coupled to said first and second terminals for selecting the central portion of the discharge and charge characteristic of said capacitor to produce the positive-going and negative-going transitions of the trapezoidal output waveforms and comprising current balancing means to insure that the output waveform transitions are at their midpoint when the capacitor is half way through its discharge-charge cycle thereby to produce at the first and second output terminals two complementary trapezoidal output waveforms the sum of which is constant.

2. A transmission line amplifier as claimed in claim 1 in which when said capacitor is half way through its charging and discharging cycle its two plates are at the same potential.

3. A transmission line amplifier as claimed in claim 1 further comprising an input stage which performs a logic function connected between the input terminal and said circuit means.

4. A transmission line amplifier as claimed in claim 1 wherein said circuit means comprises first and second transistors connected in a long-tailed pair configuration for charging and discharging said capacitor.

5. A transmission line amplifier as claimed in claim 4 further comprising means coupling the control electrode of said first transistor to said input terminal and the control electrode of the second transistor to a point of reference potential.

6. Circuit apparatus for generating first and second complementary trapezoidal output waveforms comprising, an input terminal for applying a bilevel control signal to the circuit apparatus, a pair of supply terminals for applying operating potential to the circuit apparatus, first and second transistors connected in a long-tailed pair circuit configuration to said supply terminals and with a first control electrode coupled to the input terminal, a second control electrode coupled to a source of reference voltage and first and second output electrodes, a capacitor connected across said first and second output electrodes, said long-tailed pair circuit being responsive to a control signal at the input terminal to switch between first and second stable states in which the capacitor is discharged and charged by means of said first and second transistors, and means coupled to said first and second output electrodes for selecting the central portion of the discharge and charge characteristic of said capacitor to produce the positive-going and negative-going transition portions of the complementary trapezoidal output waveforms.

7. Circuit apparatus as claimed in claim 6 wherein said first and second transistors are of the same conductivity type with the first main electrode of one transistor connected in common with the same first main electrode of the other transitor, a constant current source coupling said commoned first main electrodes to one supply terminal, impedance means individually coupling the second main electrode of each of the first and second transistors to the other supply terminal, and said first and second output electrodes being coupled to the second main electrodes of the first and second transistors, respectively.

8. Circuit apparatus as claimed in claim 6 wherein said selecting means comprises, third and fourth transistors, first and second current-distributing networks respectively coupling the signals developed at said first and second output electrodes to the control electrodes of said third and fourth transistors to cause the third and fourth transistors to follow the signal variations at the first and second output electrodes after a delay such that the signal has decreased by a given amount from its maximum value or increased by a given amount from its minimum value.

9. Circuit apparatus as claimed in claim 8 further comprising first and second emitter follower transistors coupling said first and second output electrodes to the first and second current distributing networks, and a current mirror circuit having first and second input terminals coupled to the output electrodes of said first and second emitter follower transistors, respectively.

* * * * *